(12) United States Patent
Kelly et al.

(10) Patent No.: US 7,692,489 B2
(45) Date of Patent: Apr. 6, 2010

(54) DIFFERENTIAL TWO-STAGE MILLER COMPENSATED AMPLIFIER SYSTEM WITH CAPACITIVE LEVEL SHIFTING

(75) Inventors: Daniel F. Kelly, Andover, MA (US);
Lawrence Singer, Wenham, MA (US);
Steven Decker, Sandown, NH (US);
Stephen R. Kosic, San Diego, CA (US)

(73) Assignee: Analog Devices, Inc., Norwood, MA (US)

( * ) Notice: Subject to any disclaimer, the term of this patent is extended or adjusted under 35 U.S.C. 154(b) by 43 days.

(21) Appl. No.: 11/305,069

(22) Filed: Dec. 16, 2005

(65) Prior Publication Data
US 2006/0214731 A1   Sep. 28, 2006

Related U.S. Application Data

(60) Provisional application No. 60/636,725, filed on Dec. 16, 2004.

(51) Int. Cl.
*H03F 3/45* (2006.01)
(52) U.S. Cl. .................. 330/258; 330/253; 330/260; 330/261; 330/292

(58) Field of Classification Search .................. 330/253, 330/258, 260, 261, 292
See application file for complete search history.

(56) References Cited

U.S. PATENT DOCUMENTS

| 5,589,785 | A  | * | 12/1996 | Garavan | 330/253 |
|---|---|---|---|---|---|
| 6,504,431 | B2 | * | 1/2003 | Weber et al. | 330/253 |
| 6,577,185 | B1 | * | 6/2003 | Chandler et al. | 330/258 |
| 6,677,822 | B2 | * | 1/2004 | Hasegawa | 330/258 |
| 6,756,842 | B2 | * | 6/2004 | Mehr et al. | 330/258 |
| 7,053,711 | B2 | * | 5/2006 | Bogner | 330/253 |

* cited by examiner

*Primary Examiner*—Khanh V Nguyen
(74) *Attorney, Agent, or Firm*—Kenyon & Kenyon LLP (57) ABSTRACT

A differential two-stage Miller compensated amplifier system with capacitive level shifting includes a first stage differential transconductance amplifier including first and second output nodes and an output common mode voltage, a second stage differential transconductance amplifier including non-inverting and inverting inputs and outputs and an input common mode voltage, and a level shifting capacitor circuit coupled between the first and second output nodes and the non-inverting and inverting inputs for level shifting between the output common mode voltage of the first stage and the input common mode voltage of the second stage.

25 Claims, 10 Drawing Sheets

DIFFERENTIAL TWO-STAGE MILLER COMPENSATED AMPLIFIER SYTEM WITH CAPACITIVE LEVEL SHIFTING

RELATED APPLICATIONS

This application claims priority to U.S. Provisional Application No. 60/636,725 filed Dec. 16, 2004, incorporated by reference herein.

FIELD OF THE INVENTION

This invention relates to a two-stage Miller compensated amplifier system with capacitive coupling between the stages that provides for maximum signal swing in low headroom room designs.

BACKGROUND OF THE INVENTION

A typical conventional two-stage Miller compensated amplifier system relies on directly coupling the outputs of the first stage with the inputs of the second stage. The result is that the headroom or signal swing of the second stage is limited by the output common mode voltage of the first stage. This is undesirable in many designs where a maximum swing is needed to achieve a high signal-to-noise ratio (SNR).

One conventional two-stage Miller compensated amplifier system attempts to improve this problem by utilizing a wide swing output stage. This results in outputs of the second stage being able to swing within one $V_{DSAT}$ of the rails. However, this limits the output common mode voltage of the first stage to one $V_{GS}$ above ground due to the direct connection of the first stage outputs with the inputs of the second stage. The result is the headroom and input compliance of the first stage is severely restricted, especially if current source devices are used.

BRIEF SUMMARY OF THE INVENTION

It is therefore an object of this invention to provide an improved differential two-stage Miller compensated amplifier system with capacitive level shifting.

It is a further object of this invention to provide such an improved differential two-stage Miller compensated amplifier system which increases the headroom in both stages of the amplifier system.

It is a further object of this invention to provide such an improved differential two-stage Miller compensated amplifier system which increases the available output common mode voltage swing for both stages of the system.

It is a further object of this invention to provide such an improved differential two-stage Miller compensated amplifier system which can level shift between the output common mode voltage of the first stage and the input common mode voltage of the second stage.

The invention results from the realization that an improved differential two-stage Miller compensated amplifier with capacitive level shifting that can level shift between the output common mode voltage of the first stage and the input common mode voltage of the second stage to increase the available headroom and output common mode voltage swing in both stages of the amplifier system is effected with a first stage differential transconductance amplifier including first and second output nodes and an output common mode voltage, a second stage differential transconductance amplifier including non-inverting and inverting inputs and outputs and an input common mode voltage, and a level shifting capacitor circuit coupled between the first and second output nodes of the first stage and the non-inverting and inverting inputs of the second stage that level shifts between the output common mode voltage of the first stage and the input common mode voltage of the second stage.

The subject invention, however, in other embodiments, need not achieve all these objectives and the claims hereof should not be limited to structures or methods capable of achieving these objectives.

This invention features a differential two-stage Miller compensated amplifier system with capacitive level shifting including a first stage differential transconductance amplifier including first and second output nodes and an output common mode voltage. A second stage differential transconductance amplifier includes non-inverting and inverting inputs and outputs and an input common mode voltage. A level shifting capacitor circuit is coupled between the first and second output nodes and the non-inverting and inverting inputs for level shifting between the output common mode voltage of the first stage and the input common mode voltage of the second stage.

In one embodiment, the differential two-stage Miller compensated amplifier system may further include first and second Miller compensation capacitors coupled in feedback between the non-inverting and inverting outputs and the first and second nodes. The level shifting capacitor circuit may include a first level shifting capacitor coupled between one of the first and second output nodes and one of the non-inverting and inverting inputs for charging to a first predetermined voltage and a second level shifting capacitor coupled between the other of the first and second output nodes and the other of the non-inverting and inverting inputs for charging to a second predetermined voltage. The first and second predetermined voltages may provide for level shifting between the output common mode voltage of the first stage and the input common mode voltage of the second stage. The system may further include first and second biasing circuits coupled to the first and second level shifting capacitors for charging the first and second level shifting capacitors to the first and second predetermined voltages. The first and second biasing circuits may each include at least one switch connected to a voltage source for providing the first and second predetermined voltages. The first and second biasing circuits may each include at least one resistor connected to a voltage source for providing the first and second predetermined voltages. The first and second biasing circuits may each include a resistor connected to a current source for providing the first and second predetermined voltages. The first and second biasing circuits may include a switched capacitor circuit including a sampling capacitor connected to a plurality of switching devices coupled to a plurality of voltage sources for providing the first and second predetermined voltages. The sampling capacitor in each of the first and second biasing circuits may sample the voltage between the plurality of voltage sources and charge the sampling capacitor in each of the first and second biasing circuits to a predetermined charge in one phase and may share the predetermined charge with the respective first and second level shifting capacitors in another phase. The sampling capacitor of each of the first and second biasing circuits may provide the first and second predetermined voltages to the first and second level shifting capacitors after a number of phases. The system may further include a common mode feedback circuit coupled between the non-inverting and inverting outputs of the second stage and a common mode control node of the first stage for sensing and adjusting an output common mode voltage of the second stage to a predetermined reference common mode voltage. The system may include a first common mode feedback circuit coupled between the first and second output nodes and a common mode control node of the first stage for sensing and adjusting the output common mode voltage of the first stage to a predetermined reference common mode voltage and a second common mode feedback circuit coupled between the non-inverting and inverting outputs of the second stage and a common mode control node of the second stage for sensing and adjusting an output common mode voltage of the second stage to a predetermined reference common mode voltage. The first common mode feedback circuit may charge a top plate of each of the first and second level shifting capacitors and the first and second biasing circuits charge a bottom plate of each of the first and second level shifting capacitors to provide the first and second predetermined voltages.

This invention also features a differential two-stage Miller compensated amplifier system with capacitive level shifting including a first stage differential transconductance amplifier having a first output node and a second output node and having an output common mode voltage, a second stage differential transconductance amplifier having a non-inverting input and an inverting input and an inverting output in a non-inverting output and have an input common mode voltage, a first Miller compensation capacitor coupled between the inverting output and the first node, a second Miller compensation capacitor coupled between the non-inverting output and the second node, a first level shifting capacitor coupled between the first output node and the non-inverting input charged to a first predetermined voltage, a second level shifting capacitor coupled between the second output node and the inverting input charged to a second predetermined voltage, and wherein the first and second level shifting capacitors level shift between the output common mode voltage and the input common mode voltage.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

Figure 1:
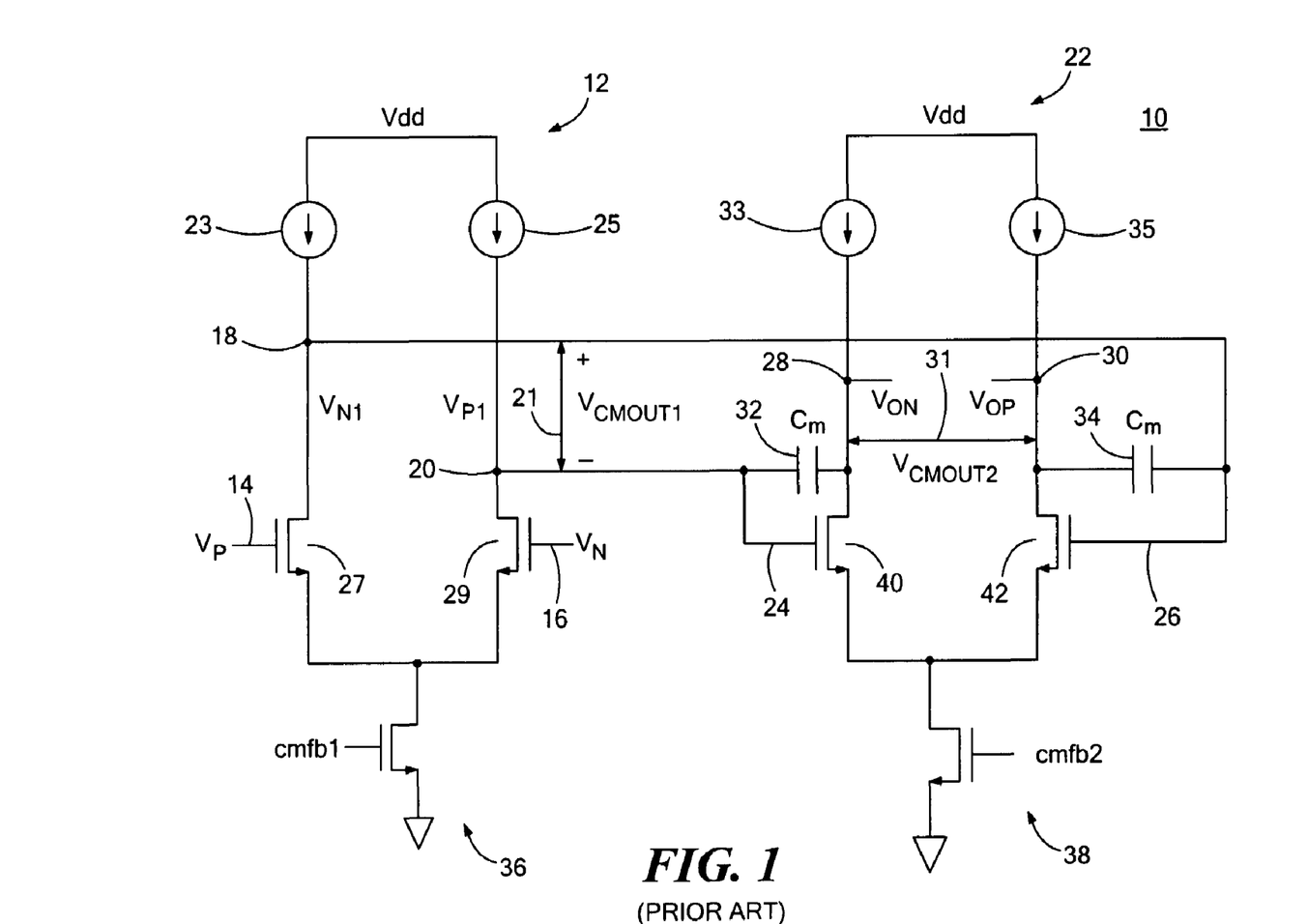
FIG. 1 is simplified schematic circuit diagram of a typical prior art two-stage Miller compensated amplifier system.

As discussed in the Background section above, conventional two-stage Miller compensated amplifier system 10 includes first differential transconductance amplifier stage 12 with differential inputs $V_P$ 14 and $V_N$ 16 and differential outputs $V_{N1}$ 18 and $V_{P1}$ 20. Second differential transconductance amplifier stage 22 includes differential inputs 24 and 26 directly coupled to differential outputs $V_{P1}$ 20 and $V_{N1}$ 18, and differential outputs $V_{ON}$ 28 and $V_{OP}$ 30. Because differential outputs $V_{N1}$ 18 and $V_{P1}$ 20 of first stage 12 are directly coupled to differential inputs 26 and 24, respectively, of second stage 22, the headroom or output common mode voltage swing $V_{CMOUT2}$ 31 of second stage 22 is limited by the output common mode voltage $V_{CMOUT1}$ 21 of first stage 12, which is undesirable in high SNR designs.

System 10 also includes Miller compensation capacitor 32 ($C_M$) coupled between differential output $V_{P1}$ 20 of stage 12 and differential output $V_{ON}$ 28 of stage 22 and Miller compensation capacitor 34 ($C_M$) coupled between differential output $V_{N1}$ 18 and differential output $V_{OP}$ 30. Stage 12 includes current source devices 23 and 25 and input devices 27 and 29, e.g., NMOS devices. Stage 22 includes current sources 33 and 35 and input devices 40 and 42, e.g., NMOS devices. Stage 12 also includes tail current device 36 that provides the tail current for stage 12 and is also used to adjust output common mode voltage $V_{CMOUT1}$ 21 of stage 12. Stage 22 includes tail current device 38 that provides the tail current for stage 22 and is also used to adjust the output common mode voltage $V_{CMOUT2}$ 31 of stage 22.

Figure 2:
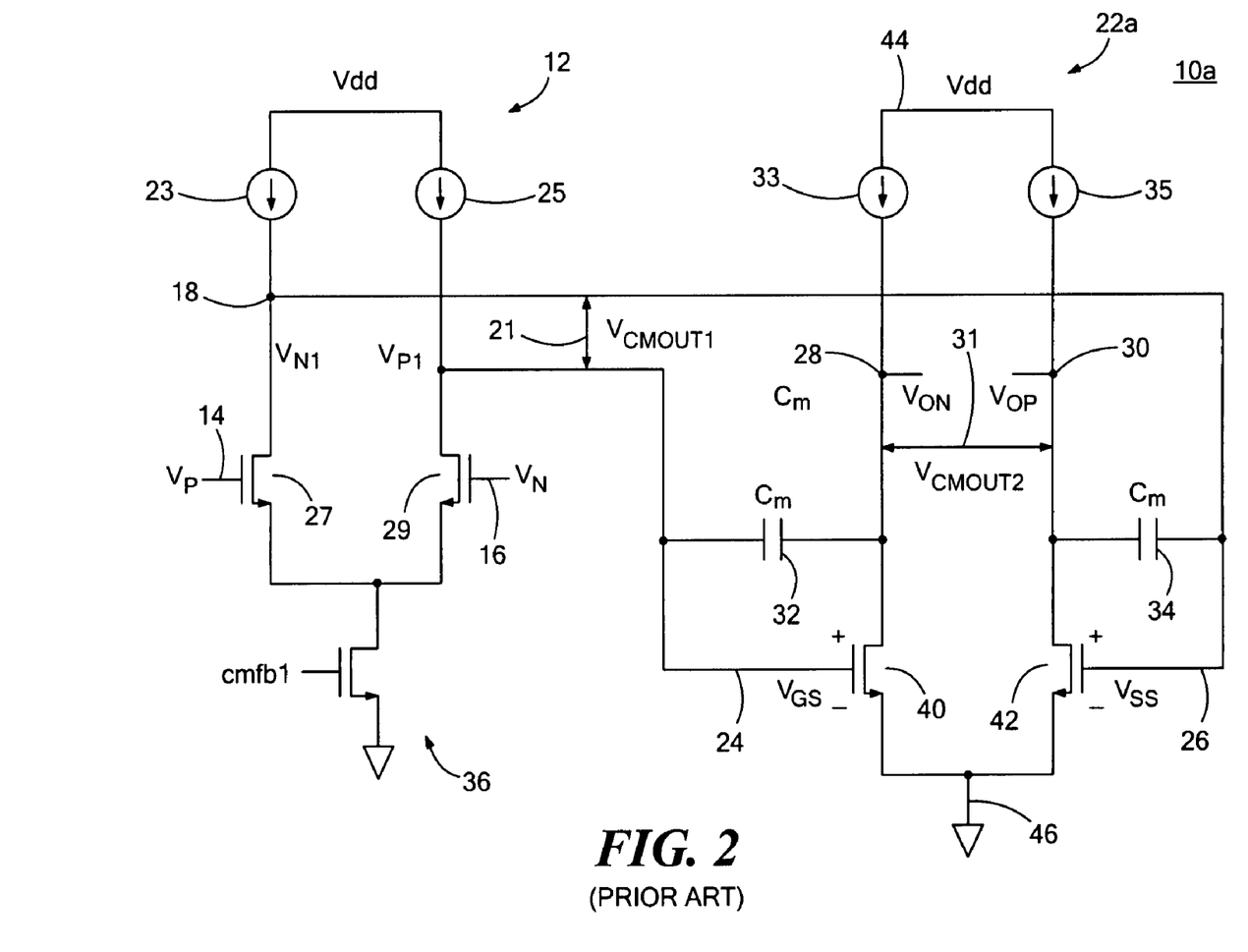
FIG. 2 is simplified schematic circuit diagram of an improved prior art two-stage Miller compensated amplifier system.

Conventional two-stage Miller compensated amplifier system 10a, FIG. 2, hereafter, like parts have been given like numbers and similar parts similar numbers accompanied by a lower case letter, includes wide swing second differential transconductance amplifier stage 22a that eliminates tail current device 38 described above. Stage 22a increases the output common mode voltage range of stage 22a such that either output voltage $V_{ON}$ 28 or $V_{OP}$ 30 can swing within one $V_{DSAT}$ of input devices 40 and 42 and the rails, e.g., $V_{dd}$ 44 and ground 46. However, the output common mode voltage $V_{CMOUT1}$ 21 of first stage 12 is restricted to one $V_{GS}$ above ground due to the direct connection of the first stage outputs $V_{P1}$ 20 and $V_{N1}$ 18 with input devices 40 and 42 of second stage 22a. This could severely restrict the headroom and input compliance of first stage 12.

Figure 3:
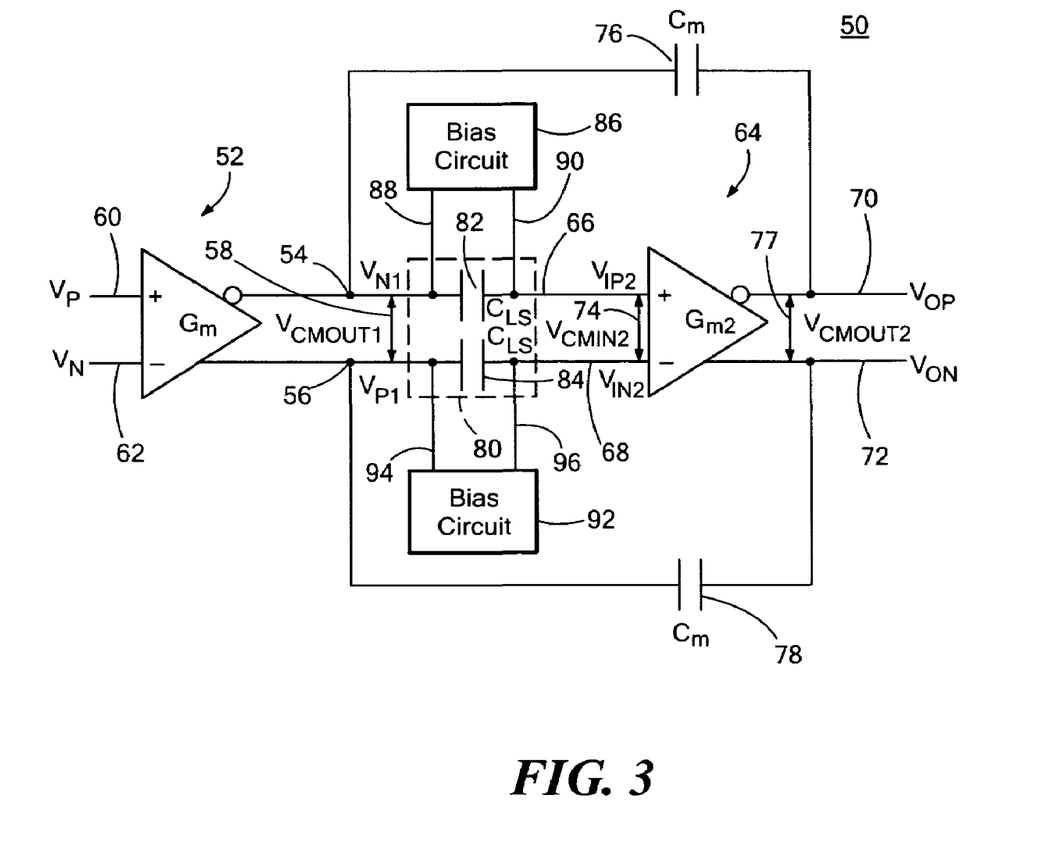
FIG. 3 is a simplified schematic circuit diagram of one embodiment of the differential two-stage Miller compensated differential amplifier system with capacitive level shifting of this invention.

In contrast, differential two-stage Miller compensated amplifier system 50, FIG. 3, of this invention with capacitive level shifting includes differential transconductance amplifier stage 52 with output nodes 54 and 56 and output common mode voltage $V_{CMOUT1}$ 58, e.g., $(V_{N1}+V_{P1})/2$. Stage 52 also includes differential input terminals 60 and 62 for receiving input signals, e.g., $V_P$ and $V_N$, respectively. System 50 also includes differential transconductance amplifier stage 64 including non-inverting input $V_{IP2}$ 66, inverting input $V_{IN2}$ 68, inverting output $V_{OP}$ 70 and non-inverting output $V_{ON}$ 72. Stage 64 also includes input common mode voltage $V_{CMIN2}$ 74, e.g., $(V_{IP2}+V_{IN2})/2$, and output common mode voltage $V_{CMOUT2}$ 77, e.g., $(V_{OP}+V_{ON})/2$. Miller compensation capacitor 76 ($C_M$) is coupled between inverting output 70 and output node 54 and Miller compensation capacitor 78 ($C_M$) is coupled between non-inverting output 72 and output node 56.

Level shifting capacitor circuit 80 is coupled between output nodes 54 and 56 and non-inverting input 66 and inverting input 68 and level shifts between output common mode voltage $V_{CMOUT1}$ 58 of stage 52 and input common mode voltage $V_{CMIN2}$ 74 of second stage 64. Level shifting between stage 52 and 64 allows each stage to operate at the optimal common mode voltage, thus optimizing the signal swing, or headroom in stages 52 and 64.

Level shifting capacitor circuit 80 typically includes level shifting capacitor 82 ($C_{LS}$) coupled between output node 54 and non-inverting input 66 and level shifting capacitor 84 ($C_{LS}$) coupled between second node 56 and inverting input 68. Level shifting capacitor 82 is charged by biasing circuit 86 to a first predetermined voltage and level shifting capacitor 84 is charged to a second predetermined voltage by biasing circuit 92. The first and second predetermined voltages on level shifting capacitors 82 and 84, respectively, provide for level shifting between output common mode voltage $V_{CMOUT1}$ 58 and input common mode voltage $V_{CMIN2}$ 74. For example, assume that the headroom requirements of differential transconductance amplifier stage 52 result in an output common mode voltage $V_{CMOUT1}$ 58 of 2.2V and the headroom requirements of stage 64 require an input common mode voltage $V_{CMIN2}$ 74 of 1.4V. Setting the first and second predetermined voltages on level shifting capacitors 82 and 84, respectively, to 0.8V provides for level shifting between the 2.2V output common mode voltage $V_{CMOUT1}$ 58 of stage 52 and the input 1.4V common mode voltage $V_{CMIN2}$ 74 of stage 64. The result is that the headroom and output common mode voltage of stage 52 and stage 64 is optimized.

Biasing circuit 86 is coupled to level shifting capacitor 82 by lines 88 and 90 and charges level shifting capacitor 82 to the first predetermined voltage. Similarly, biasing circuit 92 is coupled to level shifting capacitor 84 by lines 94 and 96 and charges level shifting capacitor 84 to the second predetermined voltage.

Figure 4:
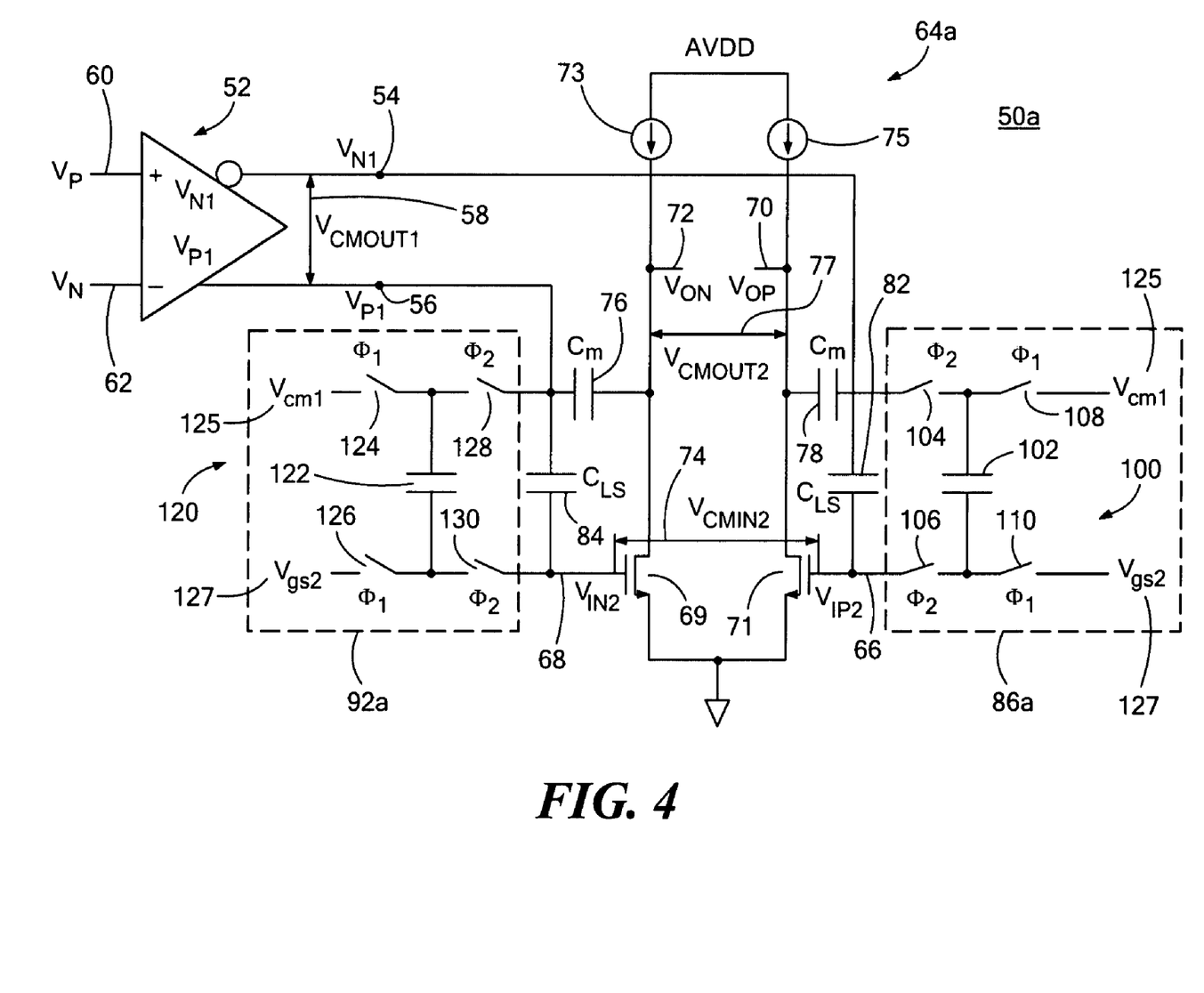
FIG. 4 is a schematic circuit diagram showing in further detail the components of the two-stage Miller compensated differential amplifier system of FIG. 3.

Differential two-stage Miller compensated amplifier system 50a, FIG. 4, includes differential transconductance amplifier stage 52 and differential transconductance amplifier stage 64a with input devices 69 and 71, e.g., NMOS type devices, and current sources 73 and 75. In this example, biasing circuit 86a includes switched capacitor circuit 100 with sampling capacitor 102 and switching devices 104, 106, 108 and 110 connected to voltage sources $V_{CM1}$ 125 and $V_{gs2}$ 127. Similarly, biasing circuit 92a includes switched capacitor circuit 120 with sampling capacitor 122 and switching devices 124, 126, 128 and 130 connected to voltage sources $V_{CM1}$ 125 and $V_{gs2}$ 127. Voltage $V_{CM1}$ 125 is typically equal to the output common mode voltage $V_{CMOUT1}$ 58 of stage 52 and voltage $V_{gs2}$ 127 is nominally equal to the input common mode voltage $V_{CMIN2}$ 74 of stage 64a. Biasing circuits 86a and 92a provide the first and second predetermined voltages to level shifting capacitors 82 and 84, respectively, by sampling the voltage difference between $V_{CM1}$ 125 and $V_{gs2}$ 127 on sampling capacitors 102 and 122, respectively, in one phase, e.g., $\Phi_1$, and sharing the sampled charge with level shifting capacitors 82 and 84, respectively, in another phase, e.g., $\Phi_2$. The process is repeated over a number of phases until the voltages on level shifting capacitors 82 and 84 are approximately equal to the first and second predetermined voltages.

For example, in a first phase, $\Phi_1$, switching devices 108 and 110 of biasing circuit 86a are closed while switching devices 104 and 106 are open. In this phase, sampling capacitor 102 samples the voltage difference between voltage sources $V_{CM1}$ 125 and $V_{gs2}$ 127 and charges sampling capacitor 102. In the next phase, $\Phi_2$, switching devices 104 and 106 are closed while switching devices 108 and 110 are open allowing the charge sampled by sampling capacitor 102 to be shared to level shifting capacitor 82. After a number of phases, the sampled voltage on level shifting capacitor 82 approximately reaches the first predetermined voltage. Biasing circuit 92a operates similarly to biasing circuit 86a and provides the second predetermined voltage on level shifting capacitor 84. The first and second predetermined voltages on level shifting capacitors 82 and 84, respectively, provide for level shifting between the output common mode voltage $V_{CMOUT1}$ 58 of stage 52 and input common mode voltage $V_{CMIN2}$ 74 of stage 64a.

Figure 5A:
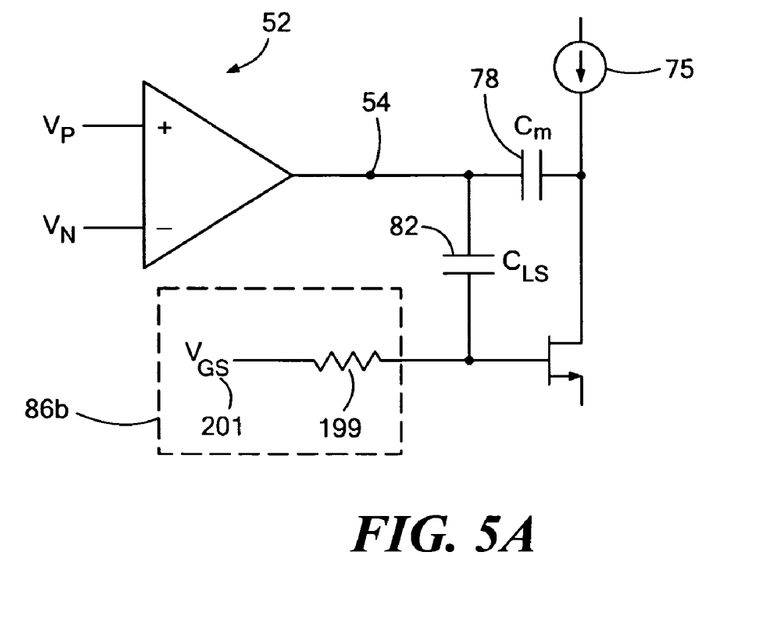
FIGS. 5A-5B are simplified schematic circuit diagrams showing various examples of the biasing circuit of FIG. 4.
Figure 5B:
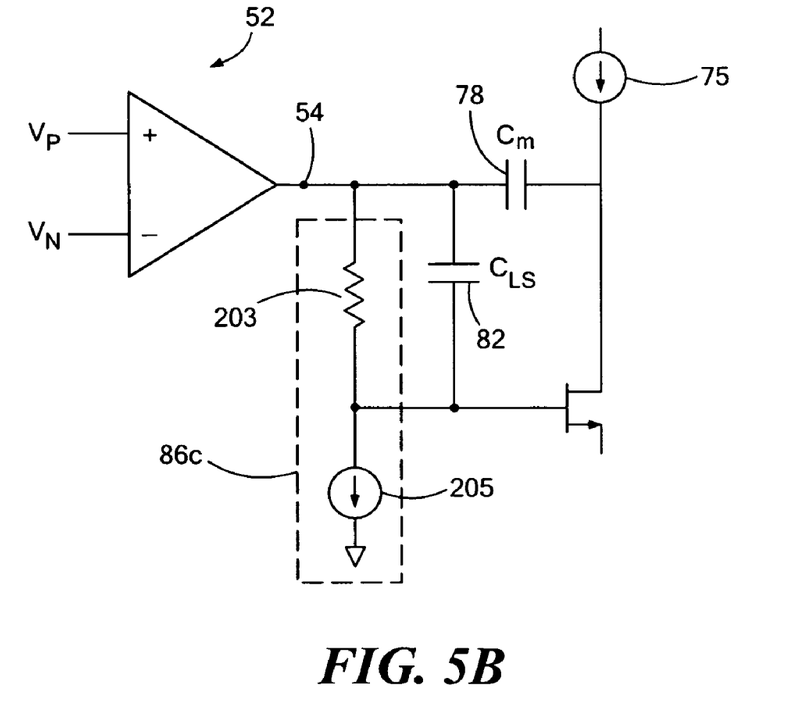

Although as shown in FIG. 4, biasing circuits 86a and 92a include a switched capacitor circuit connected to a plurality of voltage sources, this is not a necessary limitation of this invention as biasing circuits 86a and 92a need only include at least one resistor connected to a voltage source or a current source. FIG. 5A shows an example of biasing circuit 86b that includes resistor 199 connected to voltage source $V_{gs}$ 201. FIG. 5B shows an example of biasing circuit 86c that includes resistor 203 and current source 205.

Figure 6:
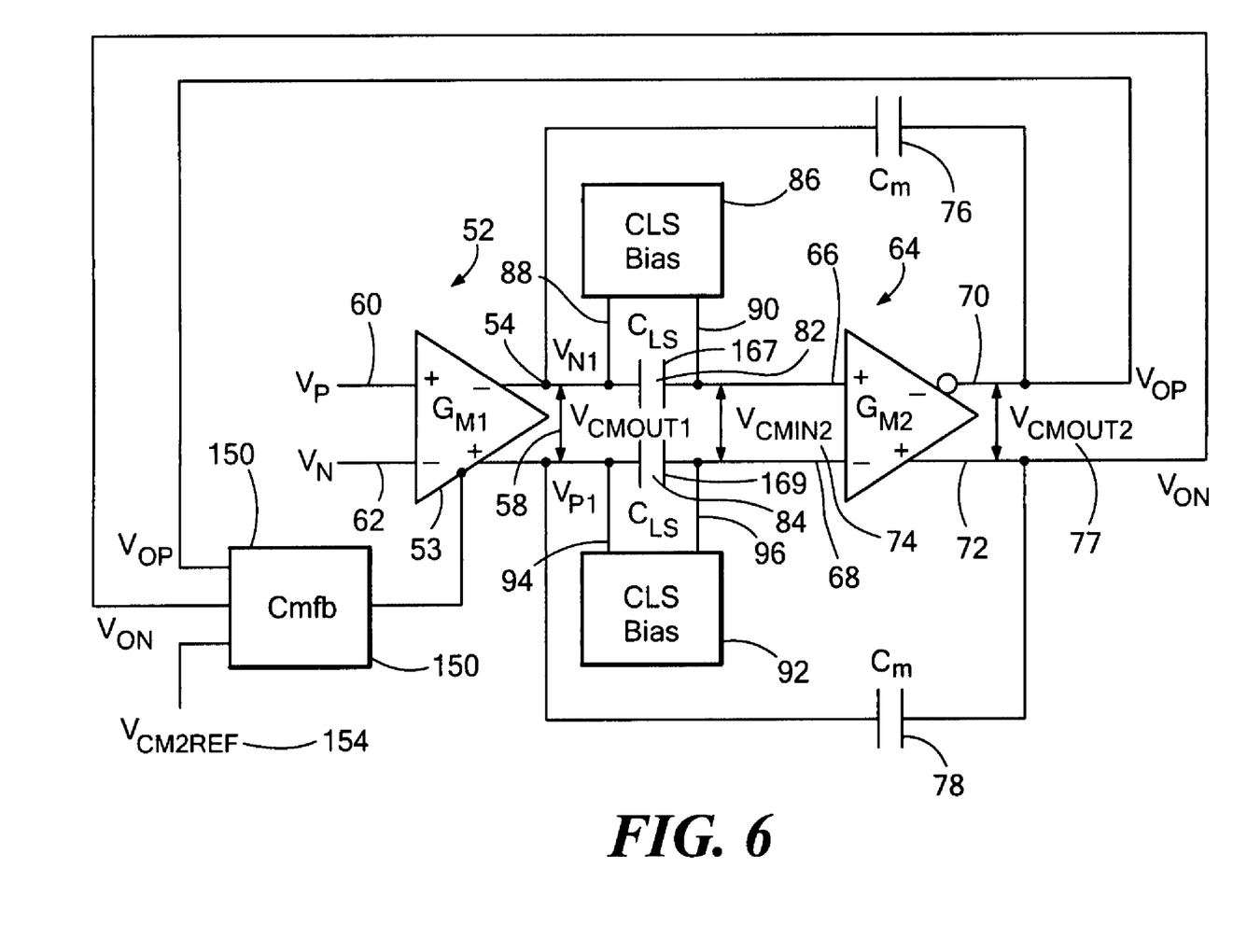
FIG. 6 is simplified schematic circuit diagram of another embodiment of the two-stage Miller compensated differential amplifier system with capacitive level shifting of this invention.

In another construction, differential two-stage Miller compensated amplifier system 50b, FIG. 6, includes common mode feedback circuit 150 coupled between inverting output $V_{OP}$ 70 and non-inverting output $V_{ON}$ 72 of stage 64 and common mode control node 53 of stage 52. Common mode feedback circuit 150 senses the output common mode voltage $V_{CMOUT2}$ 77 of stage 64 and compares $V_{CMOUT2}$ 77 to a desired reference common mode voltage $V_{CM2REF}$ 154. Any error between $V_{CMOUT2}$ 77 and $V_{CM2REF}$ 154 causes common mode feedback circuit 150 to adjust $V_{CMOUT1}$ 58 which in turn adjusts $V_{CMIN2}$ 74 of stage 64 which adjusts $V_{CMOUT2}$ 77 to the desired output common mode voltage, $V_{CM2REF}$ 154.

Figure 7:
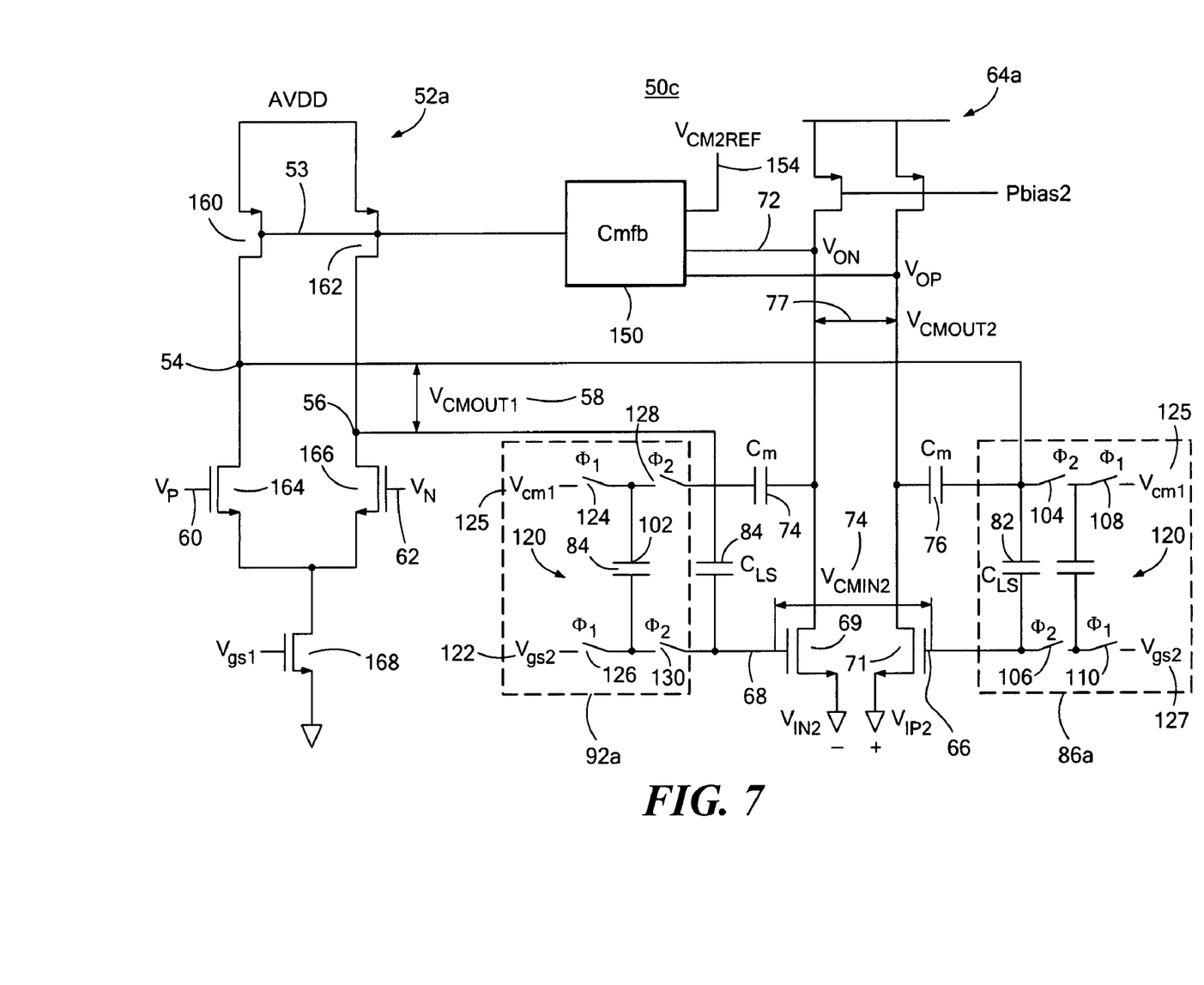
FIG. 7 is a schematic circuit diagram showing in further detail the components of the two-stage Miller compensated differential amplifier system of FIG. 6.

In yet another construction, differential two-stage Miller compensated amplifier system 50c, FIG. 7, shows another implementation of differential two-stage Miller compensated amplifier system 50b. In this example, common mode feedback circuit 150 is coupled between inverting output $V_{OP}$ 70 and non-inverting output $V_{ON}$ 72 of stage 64a and common mode control node 53 of stage 52a which connects to the gates of current source devices 160 and 162, e.g., PMOS devices. Common mode feedback circuit 150 senses the output common mode $V_{CMOUT2}$ 77 and compares $V_{CMOUT2}$ 77 with reference common mode voltage $V_{CM2REF}$ 154. Common mode feedback circuit 150 adjusts the gate voltage of current source devices 160 and 162 which varies the output common mode voltage $V_{CMOUT1}$ 58 of stage 52a. This in turn couples through level shifting capacitors 82 and 84 and adjusts the input common mode voltage $V_{CMIN2}$ 74 of stage 64a which in turn adjusts the output common mode voltage $V_{CMOUT2}$ 77 of stage 64a until it equals $V_{CM2REF}$ 154. The output common mode voltage $V_{CMOUT1}$ 58 of stage 52a is set passively to $V_{CMOUT1}$ 58 by the level shifting provided by bias circuits 92a and 86a and level shifting capacitors 82 and 84.

Differential transconductance amplifier stage 52a includes input devices 164 and 166 and tail current device 168, e.g., NMOS devices. Differential stage 64a includes input devices 69 and 71 connected to ground. System 50c includes level shifting capacitors 82 and 84 and biasing circuits 86a and 92a that provide for level shifting between $V_{CMOUT1}$ 58 and $V_{CMIN2}$ 74.

Figure 8:
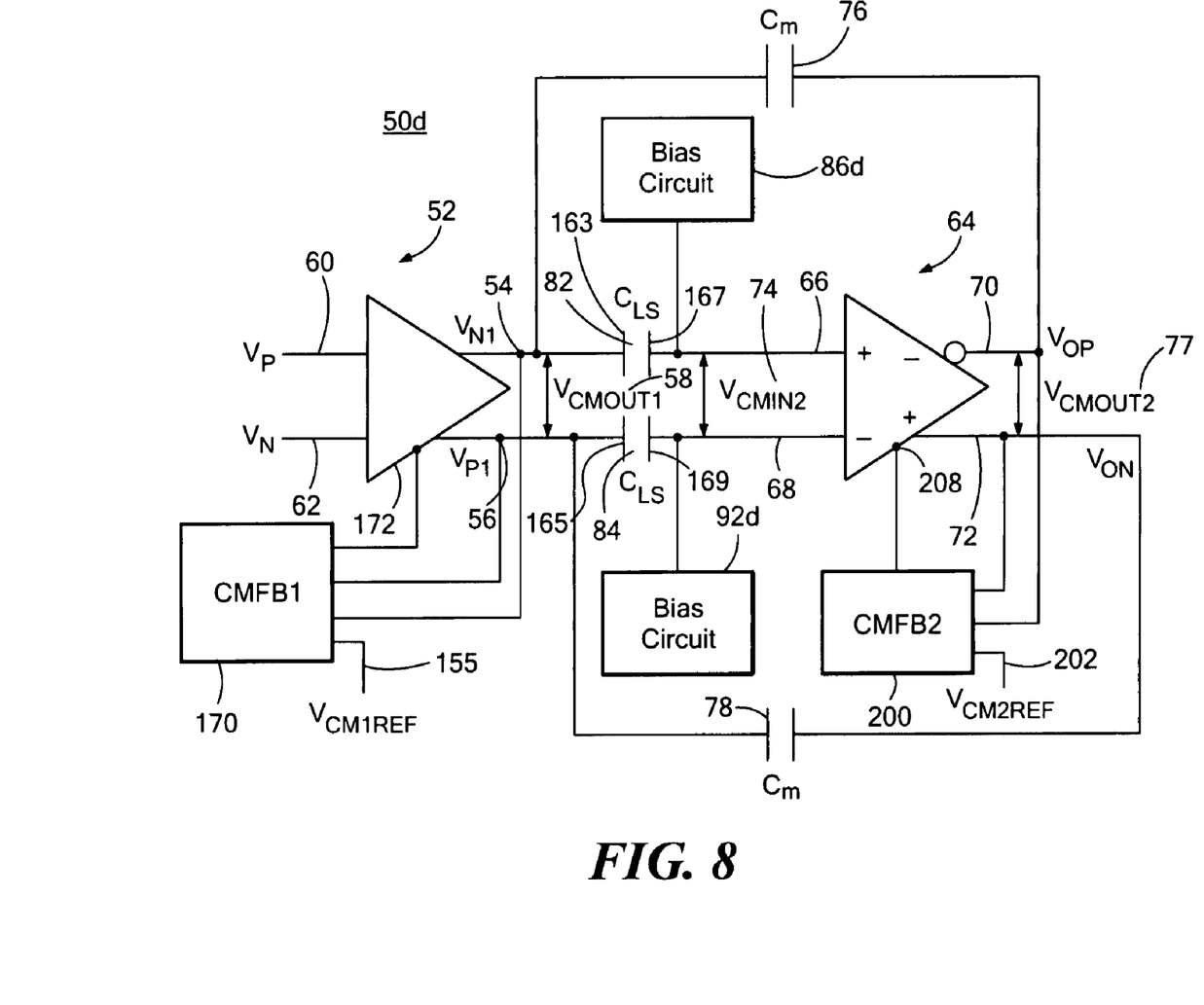
FIG. 8 is a simplified schematic circuit diagram of yet another embodiment of the differential two-stage Miller compensated differential amplifier system with capacitive leveling shifting of this invention.

Differential two-stage Miller compensated amplifier system 50d, FIG. 8, includes common mode feedback circuit 170 coupled between output nodes 54 and 56 and common mode control node 172 of stage 52. Common mode feedback circuit 170 senses the output common mode voltage $V_{CMOUT1}$ 58 of stage 52 and compares $V_{CMOUT1}$ 58 to a desired output common mode voltage $V_{CM1REF}$ 155. Any error between $V_{CMOUT1}$ 58 and $V_{CM1REF}$ 155 causes common mode feedback circuit 170 to adjust $V_{CMOUT1}$ 58 to the desired output common mode voltage, $V_{CM1REF}$ 155. System 50d also includes common mode feedback circuit 200 coupled between inverting output $V_{OP}$ 70 and non-inverting output $V_{ON}$ 72 of stage 64 and common mode control node 208 of stage 64. Common mode feedback circuit 200 senses output common mode voltage $V_{CMOUT2}$ 77 and compares $V_{CMOUT2}$ 77 to reference output common mode voltage $V_{CM2REF}$ 202. Any error between $V_{CMOUT2}$ 77 and $V_{CM2REF}$ 202 causes common mode feedback circuit 200 to adjust $V_{CMOUT2}$ 77 to the desired output common mode voltage $V_{CM2REF}$ 202. In this design, system 50d includes biasing circuits 86d and 92d that only need to charge lower plates 167 and 169 of level shifting capacitors 82 and 84, respectively, as the voltage of upper plates 163 and 165 is provided by common mode feedback circuit 170.

Figure 9:
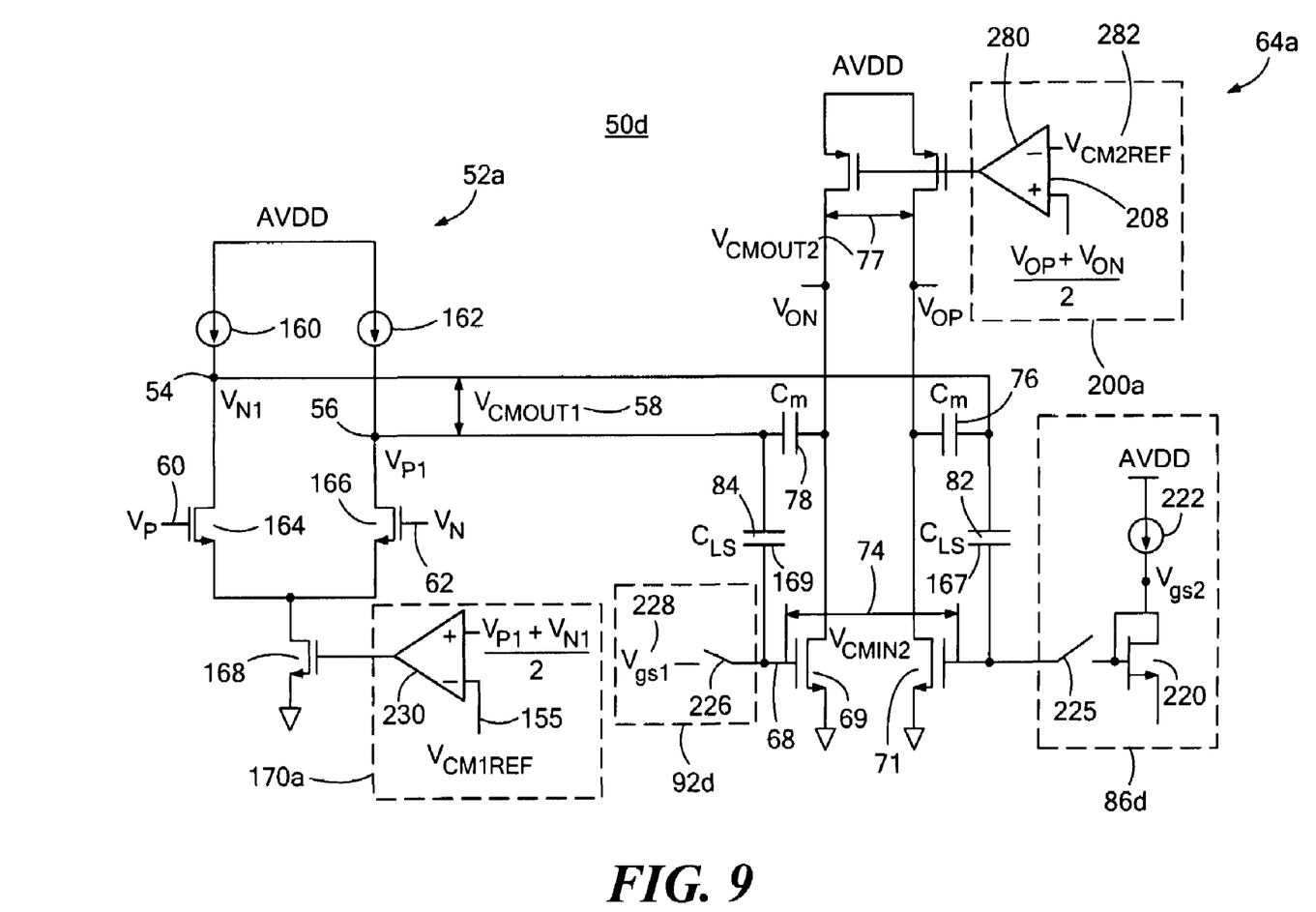
FIG. 9 is a schematic circuit diagram showing in further detail the components of the differential two-stage Miller compensated differential amplifier system with capacitive level shifting of FIG. 8.

FIG. 9 shows a typical implementation of differential two-stage Miller compensated amplifier system 50d. First stage 52a includes current sources 160 and 162 and input devices 164, 166 and tail current device 168. Common mode feedback circuit 170a includes comparator circuit 230 that compares the output common mode voltage $V_{CMOUT1}$ 58 of stage 52a, e.g., $(V_{P1}+V_{N1})/2$, with the desired output common mode voltage $V_{CM1REF}$ 155. Any error between $V_{CMOUT1}$ 58 and $V_{CM1REF}$ 155 causes common mode feedback circuit 170a to adjust $V_{CMOUT1}$ 58 to the desired output common mode voltage, $V_{CM1REF}$ 155. Common mode feedback circuit 200a includes comparator 280 that compares the output common mode voltage $V_{CMOUT2}$ 77 of stage 64a, e.g., $(V_{OP}+V_{ON})/2$, with desired output common mode voltage $V_{CM2REF}$ 282. Any error between $V_{CMOUT2}$ 77 and $V_{CM2REF}$ 202 causes common mode feedback circuit 200a to adjust $V_{CMOUT2}$ 77 to the desired output common mode voltage $V_{CM2REF}$ 202. In this example, biasing circuit 86d includes diode connected PMOS device 220 and current source 222 connected to switch 225. Biasing circuit 92d includes switch 226 connected to voltage source $V_{gs2}$ 228. Biasing circuits 86d and 92d charge lower plates 167 and 169 of level shifting capacitors 82 and 84, respectively, such that level shifting capacitors 82 and 84 level shift between output common mode voltage $V_{CMOUT1}$ 58 of stage 52a and input common mode voltage $V_{CMIN2}$ 74 of stage 64a.

Figure 10:
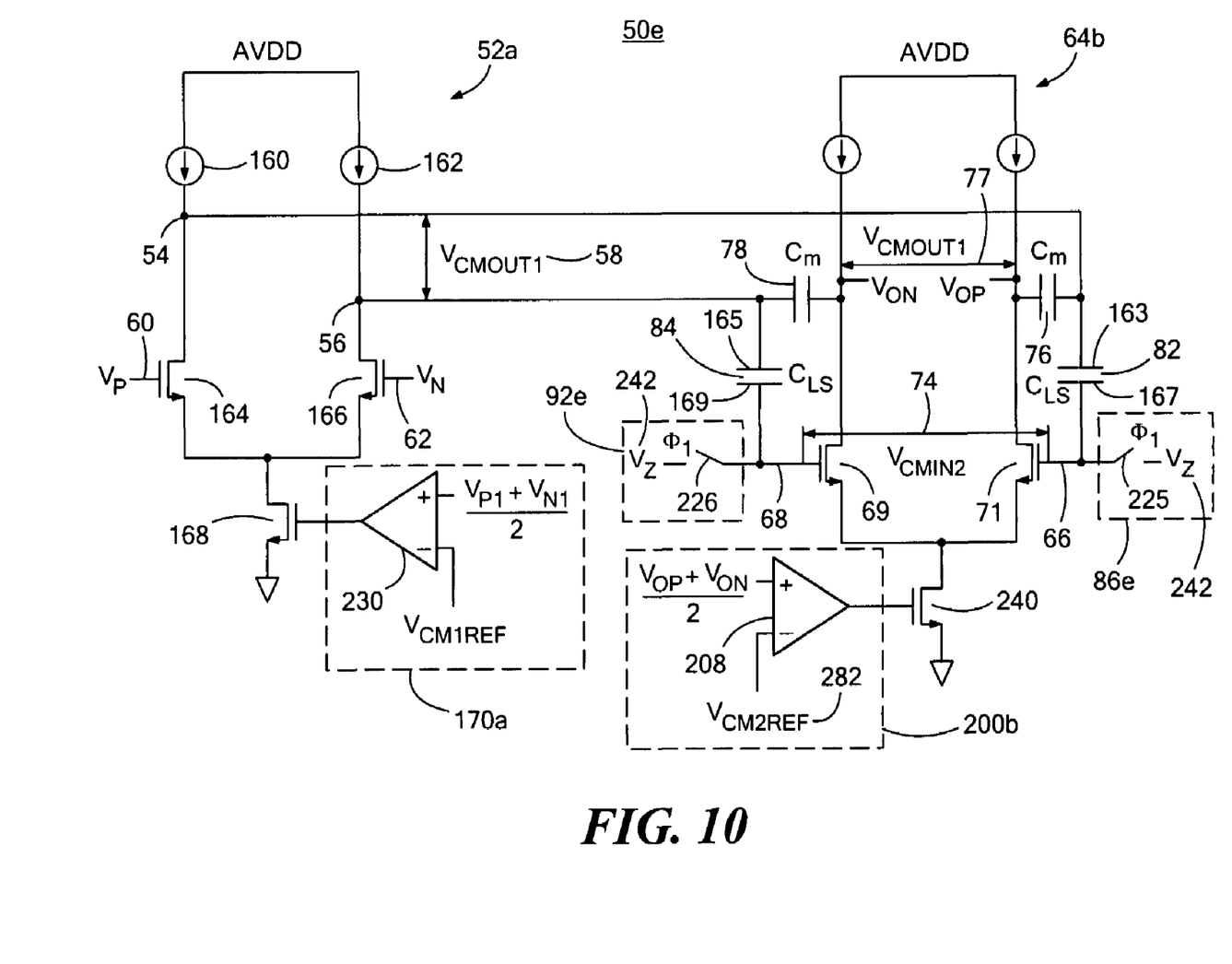
FIG. 10 is a schematic circuit diagram of another embodiment of the two-stage Miller compensated differential amplifier system with capacitive level shifting of this invention.

In another construction, differential two-stage Miller compensated amplifier system 50e, FIG. 10, shows another implementation of differential two-stage Miller compensated amplifier system 50d. In this example, stage 64b includes tail current device 240 connected to input devices 69 and 71 and common mode feedback circuit 200b. Biasing circuit 86e includes switching device 225 connected to voltage source $V_2$ 242 and biasing circuit 92e includes switching device 226 connected to voltage source $V_2$ 242. Voltage source $V_2$ 242 is a voltage typically equal to the desired input common mode voltage, $V_{CMIN2}$ 74. Preferably, $V_2$ 242 is set to the $V_{GS}$ of input devices 69 and 71 plus the $V_{DSAT}$ of tail current device 240 to provide for optimal headroom for stage 64b. $V_{CMOUT1}$ 58 can be set equal to any voltage that is optimal for stage 52a.

In operation, during a first phase, $\Phi_1$, top plates 163 and 165 of level shifting capacitor 82 and 84, respectively, are charged to $V_{CMOUT1}$ 58 via common mode feedback circuit 170a and bottom plates 167 and 169 of level shifting capacitor 82 and 84 are charged to $V_2$ 242. Thus, at the end of $\Phi_1$, the voltage difference of $V_{CMOUT1}$ 58 and $V_2$ 242 is sampled by level shifting capacitors 82 and 84.

The input common mode voltage, $V_{CMIN2}$ 74 of stage 64b may not be the optimal output common mode output $V_{CMOUT}$ 58 for stage 52a. In this case, level shifting capacitors 82 and 84 provide for level shifting between output common mode voltage $V_{CMOUT}$ 58 of stage 52a and the input common mode voltage $V_{CMIN2}$ 74 of stage 64b, thus providing optimal headroom in both stage 52a and 64b.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A differential two-stage Miller compensated amplifier system with capacitive level shifting comprising:
   a first stage differential transconductance amplifier including first and second output nodes and an output common mode voltage;
   a second stage differential transconductance amplifier including non-inverting and inverting inputs and outputs and an input common mode voltage;
   a level shifting capacitor circuit coupled between said first and second output nodes and said non-inverting and inverting inputs for level shifting and predetermined voltage charging between said output common mode voltage of said first stage and said input common mode voltage of said second stage, said level shifting capacitor circuit includes:
      a first level shifting capacitor coupled between one of said first and second output nodes and one of said non-inverting and inverting inputs for charging to a first predetermined voltage, and
      a second level shifting capacitor coupled between the other of said first and second output nodes and the other of said non-inverting and inverting inputs for charging to a second predetermined voltage; and first and second biasing circuits coupled to said first and second level shifting capacitors for charging said first and second level shifting capacitors to said first and second predetermined voltages.

2. The system of claim 1 further including first and second Miller compensation capacitors coupled in feedback between said non-inverting and inverting outputs and said first and second output nodes.

3. The system of claim 1 in which said first and second predetermined voltages provide for level shifting between said output common mode voltage of said first stage and said input common mode voltage of said second stage.

4. The system of claim 1 in which said first and second biasing circuits each include at least one switch connected to a voltage source for providing said first and second predetermined voltages.

5. The system of claim 1 in which said first and second biasing circuits each include at least one resistor connected to a voltage source for providing said first and second predetermined voltages.

6. The system of claim 1 in which said first and second biasing circuits each include a resistor connected to a current source for providing said first and second predetermined voltages.

7. The system of claim 1 in which each of said first and second biasing circuits include a switched capacitor circuit including a sampling capacitor connected to a plurality of switching devices coupled to a plurality of voltage sources for providing said first and second predetermined voltages.

8. The system of claim 7 in which said sampling capacitor in each of said first and second biasing circuits samples the voltage between said plurality of voltage sources and charges said sampling capacitor in each of said first and second biasing circuits to a predetermined charge in one phase and shares said predetermined charge with respective said first and second level shifting capacitors in another phase.

9. The system of claim 8 in which said sampling capacitor of each of said first and second biasing circuits provides said first and second predetermined voltages to said first and second level shifting capacitors after a number of phases.

10. The system of claim 1 further including a common mode feedback circuit coupled between said non-inverting and inverting outputs of said second stage and a common mode control node of said first stage for sensing and adjusting an output common mode voltage of said second stage to a predetermined reference common mode voltage.

11. The system of claim 1 further including a first common mode feedback circuit coupled between said first and second output nodes and a common mode control node of said first stage for sensing and adjusting said output common mode voltage of said first stage to a predetermined reference common mode voltage and a second common mode feedback circuit coupled between said non-inverting and inverting outputs of said second stage and a common mode control node of said second stage for sensing and adjusting an output common mode voltage of said second stage to a predetermined reference common mode voltage.

12. The system of claim 11 in which said first common mode feedback circuit charges a top plate of each of said first and second level shifting capacitors and said first and second biasing circuits charge a bottom plate of each of said first and second level shifting capacitors to provide said first and second predetermined voltages.

13. The system of claim 10 in which the first stage includes two current source devices and the common mode control node of the first stage connects to the gates of the two current source devices.

14. A differential multi-stage amplifier system comprising:

a first stage differential transconductance amplifier having a first output node and a second output node and having an output common mode voltage;

a second stage differential transconductance amplifier having a non-inverting input and an inverting input and an inverting output and a non-inverting output and having an input common mode voltage;

a first level shifting capacitor coupled between said first output node and said non-inverting input;

a first biasing circuit coupled to the first level shifting capacitor to charge the first level shifting capacitor to a first predetermined voltage;

a second level shifting capacitor coupled between said second output node and said inverting input;

a second biasing circuit coupled to the second level shifting capacitor to charge the second level shifting capacitor to a second predetermined voltage; and wherein said first and second level shifting capacitors level shift between said output common mode voltage and said input common mode voltage.

15. The system of claim 14 further comprising:

a first Miller compensation capacitor coupled between said inverting output and said first output node; and a second Miller compensation capacitor coupled between said non-inverting output and said second output node.

16. The system of claim 14 in which said first and second biasing circuits each include at least one switch connected to a voltage source for providing said first and second predetermined voltages.

17. The system of claim 14 in which said first and second biasing circuits each include at least one resistor connected to a voltage source for providing said first and second predetermined voltages.

18. The system of claim 14 in which said first and second biasing circuits each include a resistor connected to a current source for providing said first and second predetermined voltages.

19. The system of claim 14 in which each of said first and second biasing circuits include a switched capacitor circuit including a sampling capacitor connected to a plurality of switching devices coupled to a plurality of voltage sources for providing said first and second predetermined voltages.

20. The system of claim 19 in which said sampling capacitor in each of said first and second biasing circuits samples the voltage between said plurality of voltage sources and charges said sampling capacitor in each of said first and second biasing circuits to a predetermined charge in one phase and shares said predetermined charge with respective said first and second level shifting capacitors in another phase.

21. The system of claim 20 in which said sampling capacitor of each of said first and second biasing circuits provides said first and second predetermined voltages to said first and second level shifting capacitors after a number of phases.

22. The system of claim 14 further including a common mode feedback circuit coupled between said non-inverting and inverting outputs of said second stage and a common mode control node of said first stage for sensing and adjusting an output common mode voltage of said second stage to a predetermined reference common mode voltage.

23. The system of claim 22 in which the first stage includes two current source devices and the common mode control node of the first stage connects to the gates of the two current source devices.

24. The system of claim 14 further including a first common mode feedback circuit coupled between said first and second output nodes and a common mode control node of said first stage for sensing and adjusting said output common mode voltage of said first stage to a predetermined reference common mode voltage and a second common mode feedback circuit coupled between said non-inverting and inverting outputs of said second stage and a common mode control node of said second stage for sensing and adjusting an output common mode voltage of said second stage to a predetermined reference common mode voltage.

25. The system of claim 24 in which said first common mode feedback circuit charges a top plate of each of said first and second level shifting capacitors and said first and second biasing circuits charge a bottom plate of each of said first and second level shifting capacitors to provide said first and second predetermined voltages.

* * * * *